(12) United States Patent
Wakashima et al.

(10) Patent No.: US 11,297,271 B2
(45) Date of Patent: Apr. 5, 2022

(54) IMAGE SENSOR AND IMAGE CAPTURE APPARATUS

(71) Applicant: CANON KABUSHIKI KAISHA, Tokyo (JP)

(72) Inventors: Shunichi Wakashima, Kawasaki (JP); Koichi Fukuda, Tokyo (JP); Kohei Okamoto, Yokohama (JP)

(73) Assignee: Canon Kabushiki Kaisha, Tokyo (JP)

(*) Notice: Subject to any disclaimer, the term of this patent is extended or adjusted under 35 U.S.C. 154(b) by 141 days.

(21) Appl. No.: 16/775,579

(22) Filed: Jan. 29, 2020

(65) Prior Publication Data

US 2020/0252568 A1 Aug. 6, 2020

(30) Foreign Application Priority Data

Feb. 6, 2019 (JP) .............................. JP2019-019959

(51) Int. Cl.
*H04N 5/3745* (2011.01)
*H01L 27/146* (2006.01)
*G03B 13/36* (2021.01)

(52) U.S. Cl.
CPC .......... *H04N 5/3745* (2013.01); *G03B 13/36* (2013.01); *H01L 27/14623* (2013.01); *H01L 27/14627* (2013.01)

(58) Field of Classification Search
CPC ............................ H04N 5/3745; G03B 13/36; H01L 27/14627; H01L 27/14623; H01L 27/14625; H01L 27/14621
See application file for complete search history.

(56) References Cited

U.S. PATENT DOCUMENTS

| 9,165,964 | B2 | 10/2015 | Fukuda | |
|---|---|---|---|---|
| 10,021,328 | B2 | 7/2018 | Takada et al. | |
| 10,204,943 | B2 | 2/2019 | Suzuki et al. | |
| 10,298,867 | B2 | 5/2019 | Takada et al. | |
| 2009/0224348 | A1* | 9/2009 | Matsushita | ....... H01L 27/14627 257/432 |
| 2012/0267743 | A1* | 10/2012 | Nakamura | ........ H01L 27/14627 257/432 |

(Continued)

FOREIGN PATENT DOCUMENTS

| JP | 2008-016559 A | 1/2008 |
|---|---|---|
| WO | 2016/114154 A1 | 7/2016 |

OTHER PUBLICATIONS

U.S. Appl. No. 16/780,666, filed Feb. 3, 2020 (First Named Inventor: Fumihiro Inui).

*Primary Examiner* — Shahbaz Nazrul
(74) *Attorney, Agent, or Firm* — Venable LLP

(57) ABSTRACT

An image sensor comprising pixels each includes, an photoelectric conversion unit, a first inner-layer lens, a second inner-layer lens, and an on-chip microlens. A light-shielding wall around the second inner-layer lens is provided between adjacent pixels. A first positional difference between center positions of the first inner-layer lens and the photoelectric conversion unit, a second positional difference between center positions of the second inner-layer lens and the photoelectric conversion unit, and a third positional difference between center positions of the on-chip microlens and the photoelectric conversion unit satisfy: the second positional difference<the first positional difference<the third positional difference.

10 Claims, 7 Drawing Sheets

(56) References Cited

U.S. PATENT DOCUMENTS

| | | | | |
|---|---|---|---|---|
| 2013/0258259 A1* | 10/2013 | Nakai | ................ | H04N 9/04557 349/106 |
| 2015/0109501 A1* | 4/2015 | Sekine | .............. | H01L 27/14685 348/294 |
| 2017/0338265 A1 | 11/2017 | Yoshiba et al. | | |
| 2019/0096932 A1* | 3/2019 | Hseih | ................ | H01L 27/14627 |

* cited by examiner

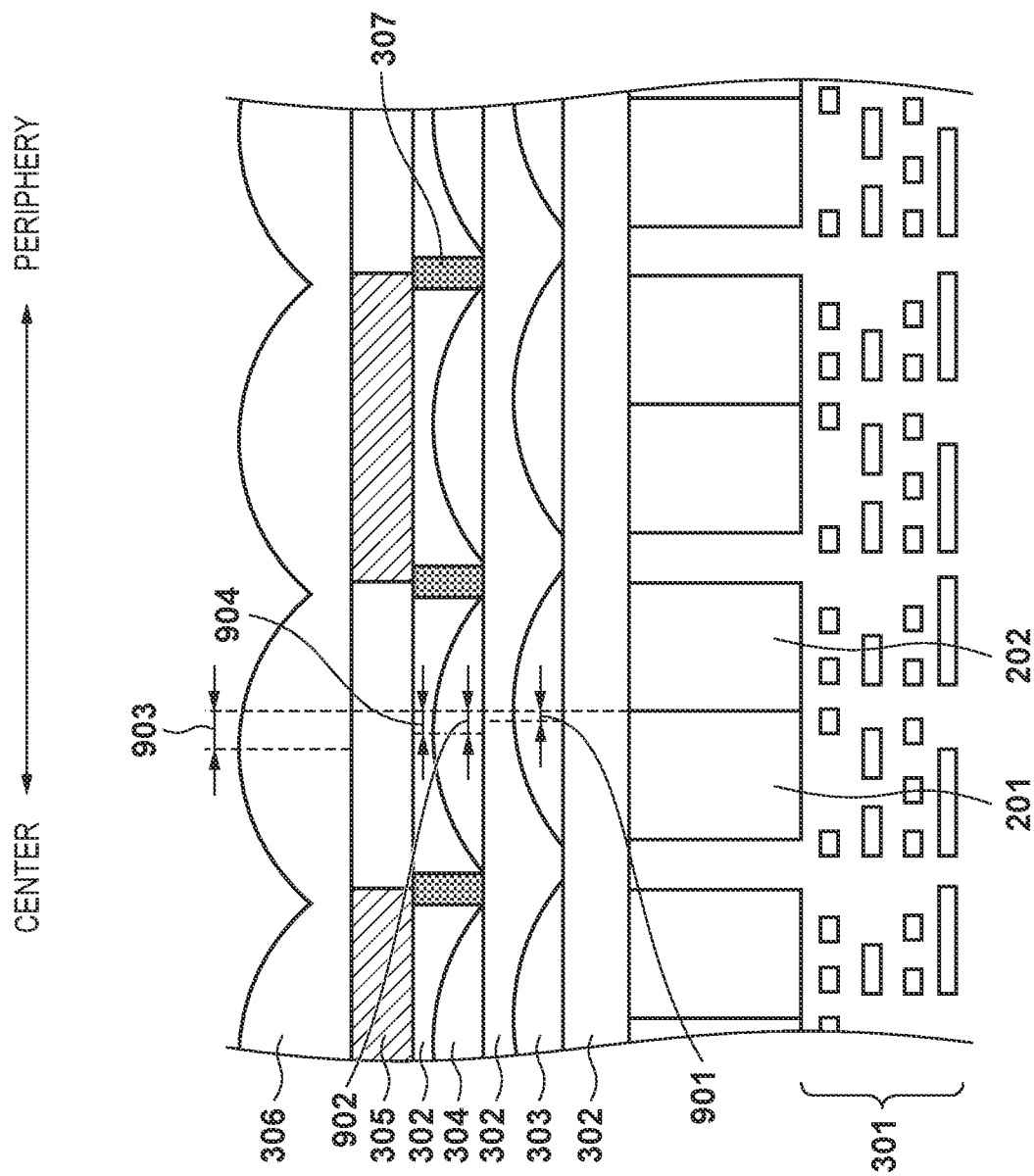

IMAGE SENSOR AND IMAGE CAPTURE APPARATUS

BACKGROUND OF THE INVENTION

Field of the Invention

The present invention relates to an image sensor and an image capture apparatus.

Description of the Related Art

In order to efficiently guide light entering from an imaging lens to light-receiving surfaces of pixels of an image sensor, an on-chip microlens is provided in each pixel. Also, it has been proposed to form another lens (an inner lens) between an on-chip microlens and a light-receiving surface in order to further increase a light condensing ratio (Japanese Patent Laid-Open No. 2008-16559 (Patent Document 1)).

International Publication No. 2016/114154 (Patent Document 2) proposes a configuration in which a plurality of planarization layer films are provided between an on-chip microlens and a light-receiving surface in a back-side illuminated image sensor to inhibit crosstalk from adjacent pixels. Patent Document 2 also discloses to provide the planarization film with an inner lens.

In Patent Document 2, in order to prevent light from entering from adjacent pixels and prevent light from leaking to adjacent pixels, each planarization film is provided with a light-shielding wall between pixels. However, in order to provide a plurality of planarization films having light-shielding walls, it is inevitable that the manufacturing process becomes complicated.

SUMMARY OF THE INVENTION

According to an aspect of the present invention, an image sensor capable of increasing the light condensing ratio for condensing light in pixels while inhibiting incidence of unnecessary light using a simple configuration is provided.

According to an aspect of the present invention, there is provided an image sensor comprising a pixel array in which pixels each including a photoelectric conversion unit are two-dimensionally arranged, wherein: the pixels each include, in addition to the photoelectric conversion unit, a first inner-layer lens, a second inner-layer lens whose distance from the photoelectric conversion unit is larger than a distance from the photoelectric conversion unit to the first inner-layer lens, and an on-chip microlens whose distance from the photoelectric conversion unit is larger than the distance from the photoelectric conversion unit to the second inner-layer lens; a light-shielding wall around the second inner-layer lens is provided between adjacent pixels; and a first positional difference between a center position of the first inner-layer lens and a center position of the photoelectric conversion unit, a second positional difference between a center position of the second inner-layer lens and the center position of the photoelectric conversion unit, and a third positional difference between a center position of the on-chip microlens and the center position of the photoelectric conversion unit satisfy the following relationship: the second positional difference<the first positional difference<the third positional difference.

According to another aspect of the present invention, there is provided an image capture apparatus that comprises and uses an image sensor, wherein the image sensor comprises a pixel array in which pixels each including a photoelectric conversion unit are two-dimensionally arranged, wherein: the pixels each include, in addition to the photoelectric conversion unit, a first inner-layer lens, a second inner-layer lens whose distance from the photoelectric conversion unit is larger than a distance from the photoelectric conversion unit to the first inner-layer lens, and an on-chip microlens whose distance from the photoelectric conversion unit is larger than the distance from the photoelectric conversion unit to the second inner-layer lens; a light-shielding wall around the second inner-layer lens is provided between adjacent pixels; and a first positional difference between a center position of the first inner-layer lens and a center position of the photoelectric conversion unit, a second positional difference between a center position of the second inner-layer lens and the center position of the photoelectric conversion unit, and a third positional difference between a center position of the on-chip microlens and the center position of the photoelectric conversion unit satisfy the following relationship: the second positional difference<the first positional difference<the third positional difference.

According to a further aspect of the present invention, there is provided an image capture apparatus comprising: an image sensor that comprises a pixel array in which pixels each including a photoelectric conversion unit being divided into a plurality of photoelectric conversion subunits are two-dimensionally arranged, wherein: the pixels each include, in addition to the photoelectric conversion unit, a first inner-layer lens, a second inner-layer lens whose distance from the photoelectric conversion unit is larger than a distance from the photoelectric conversion unit to the first inner-layer lens, and an on-chip microlens whose distance from the photoelectric conversion unit is larger than the distance from the photoelectric conversion unit to the second inner-layer lens; a light-shielding wall around the second inner-layer lens is provided between adjacent pixels; and a first positional difference between a center position of the first inner-layer lens and a center position of the photoelectric conversion unit, a second positional difference between a center position of the second inner-layer lens and the center position of the photoelectric conversion unit, and a third positional difference between a center position of the on-chip microlens and the center position of the photoelectric conversion unit satisfy the following relationship; an image processing circuit configured to generate a pair of image signals for phase difference AF based on signals obtained by the plurality of photoelectric conversion subunits of the image sensor; and one or more processors that execute a program stored in a memory and thereby function as: a focus detection unit configured to perform focus detection of an optical system of a lens unit based on a phase difference between the pair of image signals.

Further features of the present invention will become apparent from the following description of exemplary embodiments with reference to the attached drawings.

BRIEF DESCRIPTION OF THE DRAWINGS

FIG. 6 is a vertical cross-sectional view of pixels of an image sensor according to a comparative example.

DESCRIPTION OF THE EMBODIMENTS

Figure 1A:
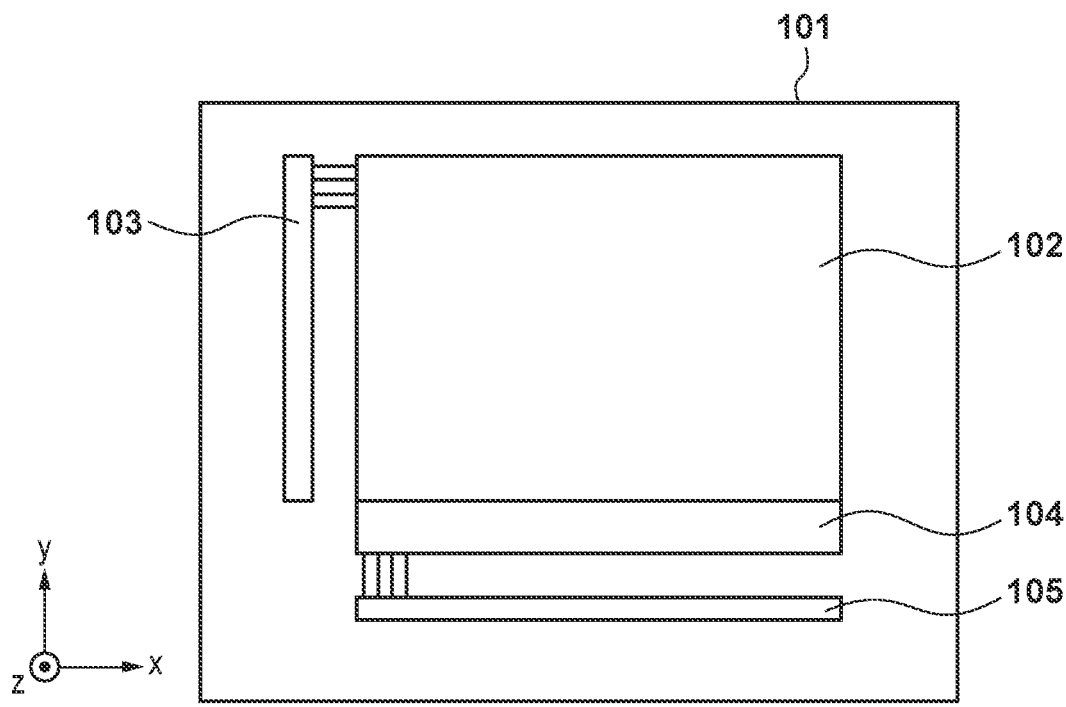
FIGS. 1A and 1B are diagrams regarding an image sensor according to an embodiment.

Exemplary embodiments of the present invention will now be described in detail in accordance with the accompanying drawings. Note that the following embodiments do not limit the invention according to the claims. Also, although a plurality of characteristics are described in an embodiment, all of the characteristics are not essential to the invention, and a plurality of characteristics may be combined optionally. Also, the same or similar configurations are given the same reference numerals in the attached drawings, and redundant description is omitted.

First Embodiment

FIG. 1A is a diagram schematically showing a configuration example of an image sensor 101 according to a first embodiment of the present invention.

A pixel array 102 includes signal lines and a plurality of pixels that are two-dimensionally arranged. Each pixel includes a microlens, a photoelectric conversion unit, and a readout circuit in this embodiment. Here, the microlens includes an on-chip microlens and an inner lens. Also, the photoelectric conversion unit is divided into two photoelectric conversion subunits. Note that the number of divisions of the photoelectric conversion units is not limited to two.

A vertical selection circuit 103 generates signals for selecting pixels arranged in the pixel array 102 in units of rows. Signals are read out from pixels arranged in the selected row, and are input to a column circuit 104 through a vertical signal line. One vertical signal line may be provided for a predetermined number of pixel columns, or a plurality of vertical signal lines may be provided for one pixel column.

The column circuit 104 is connected to all of the vertical signal lines, and separately holds signals that are read out from the pixels. The column circuit 104 may be configured to apply, to signals, one or more signal processes such as amplification, noise removal, and A/D conversion, for example.

A horizontal selection circuit 105 outputs the signals held in the column circuit 104 to a horizontal output line successively, at random, or simultaneously.

Hereinafter, a description will be given, presuming that an xyz-orthogonal coordinate system has an xy-plane that is parallel to the imaging plane of the pixel array 102, and a z-axis that is perpendicular to the xy-plane. Note that the z-axis is set such that the positive direction extends in a direction approaching the imaging lens (an exit pupil). Also, it is presumed that, with regard to the structure of a pixel, the positive direction of the z-axis indicates the top, and the negative direction thereof indicates the bottom.

Figure 1B:
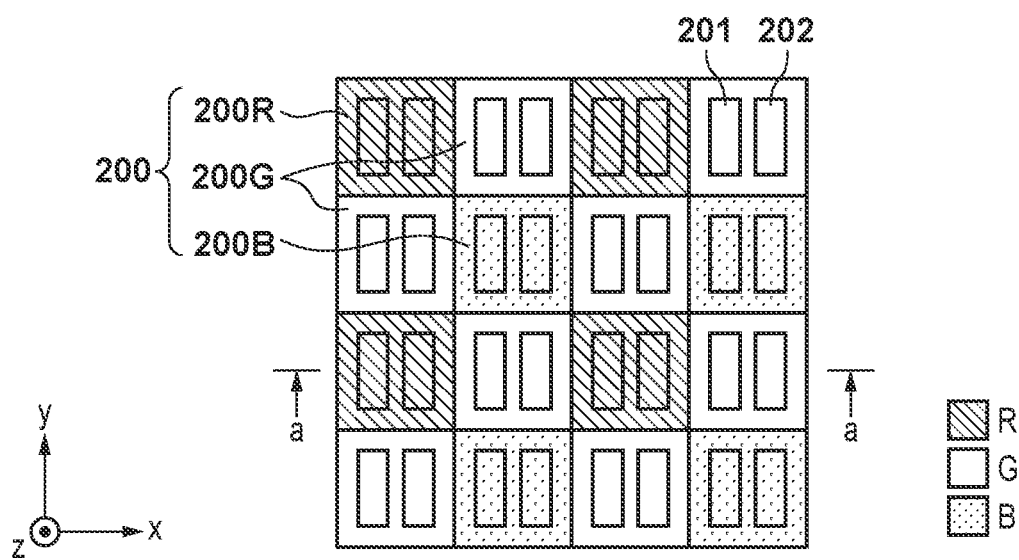

FIG. 1B shows an exemplary arrangement of photoelectric conversion subunits and color filters with regard to 16 pixels in 4 columns×4 rows, out of the pixels arranged in the pixel array 102. In the image sensor 101 according to this embodiment, for each pixel group 200 constituted by 4 pixels in 2 columns×2 rows, an upper left pixel is provided with a red (R) color filter, a lower right pixel is provided with a blue (B) color filter, and lower left and upper right pixels are provided with green (G) color filters. A pixel 200R provided with a red color filter is referred to as an R pixel, a pixel 200B provided with a blue color pixel is referred to as a B pixel, and a pixel 200G provided with a green color filter is referred to as a G pixel. Also, the photoelectric conversion unit of each pixel is divided such that two photoelectric conversion subunits 201 and 202 are disposed side-by-side in the x-direction. It is presumed that the photoelectric conversion subunits 201 and 202 are each realized by a separate photodiode (PD), and, out of the photoelectric conversion subunits 201 and 202, the photoelectric conversion subunit 201 having a small x-coordinate is referred to as a PDA, and a photoelectric conversion subunit 202 having a large x-coordinate is referred to as a PDB hereinafter.

The pixel array 102 is constituted by repetitive patterns of pixels in 4 columns×4 rows (PDs in 8 columns×4 rows) shown in FIG. 1B. Note that the PDA and the PDB can separately read out signals. The signals that are read out from one of the PDA and the PDB can be used as focus detection signals for phase-difference AF. Also, a signal obtained by adding the signals that are read out from the PDAs and PDBs in the same pixel can be used as a normal image signal. That is, in this embodiment, each pixel is configured to be capable of outputting an image signal and a focus detection signal. Note that some of the pixels may be formed as focus detection pixels having only the PDAs or PDBs.

Figure 2:
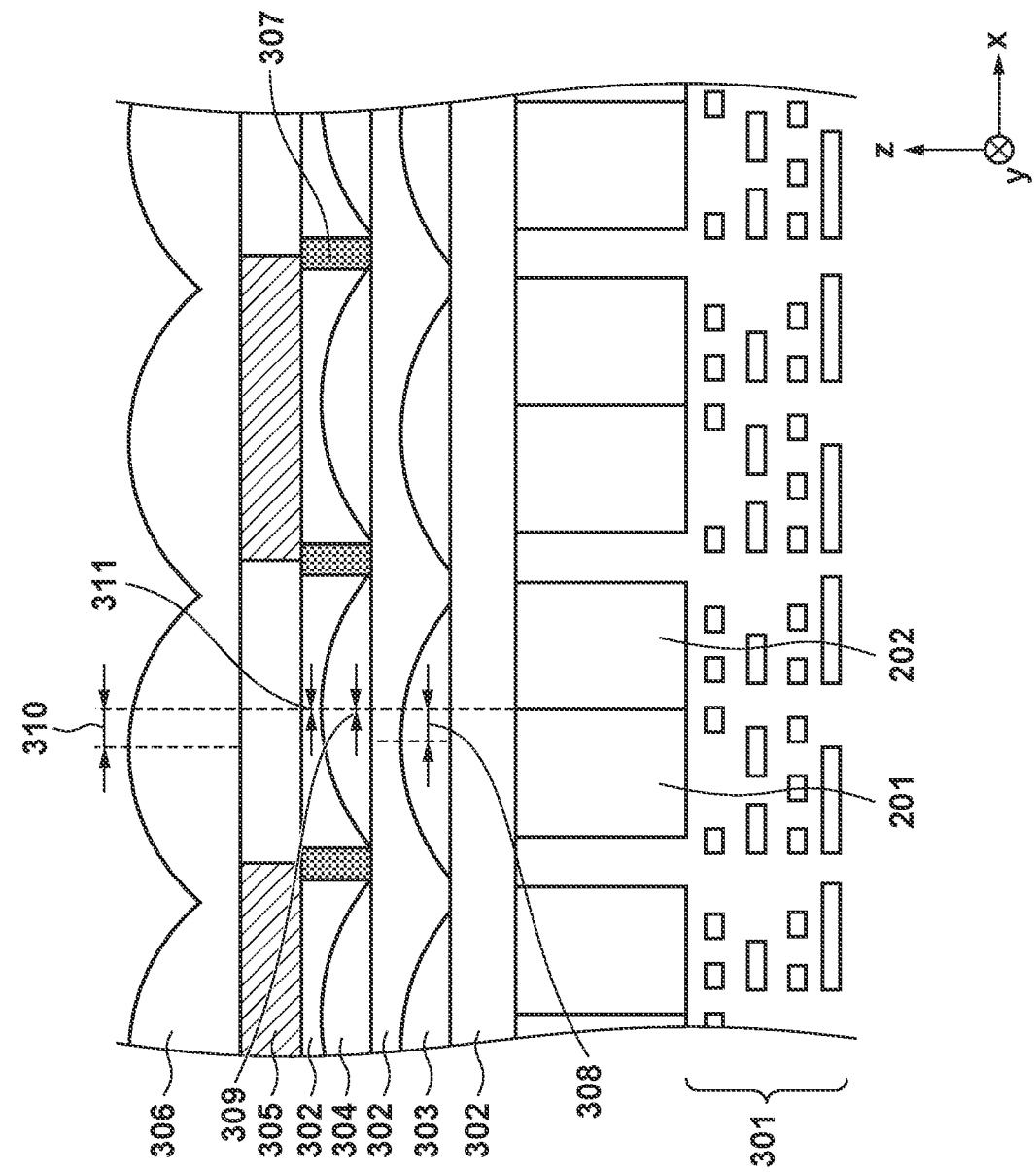
FIG. 2 is a vertical cross-sectional view of pixels of an image sensor according to an embodiment.

FIG. 2 is a partial cross-sectional view taken along line a-a (the xz-plane) shown in FIG. 1B, viewed from the −y side. An interconnect layer 301 for reading out signals from pixels are arranged in a region (the lower side) whose z-coordinate is smaller than that of the photoelectric conversion unit (the photoelectric conversion subunits 201 and 202). Also, an insulating portion 302, a first inner-layer lens 303, an insulating portion 302, a second inner-layer lens 304, an insulating portion 302, a color filter 305, and an on-chip microlens 306 are disposed, from the bottom, in a region (the upper side) whose z-coordinate is larger than that of the photoelectric conversion unit. One on-chip microlens 306, one first inner-layer lens 303, and one second inner-layer lens 304 are provided in one pixel. A light-shielding wall 307 is provided between adjacent pixels around the second inner-layer lens 304. The light-shielding walls 307 are provided in a grid pattern on the entire pixel array 102.

With regard to a given target pixel, the center position (the xy-coordinates) of a photoelectric conversion region and the center position (the xy-coordinates) of the lens members (the first inner-layer lens 303, the second inner-layer lens 304, and the on-chip microlens 306) provided for the target pixel have a positional difference according to an image height of the pixel. Here, the image height refers to the distance from an intersection (also referred to as the center of the pixel array 102) between the image sensor and the optical axis of the imaging lens. Also, the positional difference of the center position indicates a positional difference (the positional difference in a direction toward the center of the pixel array 102) on a straight line connecting the center position of a photoelectric conversion region of the target pixel and the center of the pixel array 102.

Specifically, a second pixel having a second image height that is larger than a first image height has a larger positional difference in the center position than a first pixel having the first image height. The larger the image height of a pixel is (the farther the pixel is from the center of the pixel array 102), the larger the positional difference in the center position between the pixel and the corresponding lens member is, for example. Alternatively, a configuration may be adopted in which the positional difference in the center position increases stepwise following an increase in the image height. It is sufficient that the positional difference in the center position increases with respect to an increase in the image height as a whole, and the positional difference may change linearly, non-linearly, stepwise, or in the manner of a combination thereof. A configuration may be adopted in which the positional difference of a pixel included in the center region of the pixel array 102 (a region in which the image height is less than a predetermined value) is set to 0, and with regard to a pixel having an image height of the predetermined value or more, the positional difference linearly increases following an increase in the image height, for example.

Also, in this embodiment, the lens members are disposed such that a positional difference 309 of the second inner-layer lens 304<a positional difference 308 of the first inner-layer lens 303<a positional difference 310 of the on-chip microlens 306 holds true. That is, a second lens member is included which has a positional difference that is smaller than the positional difference of a first lens member disposed at a first distance from a photoelectric conversion unit and that is disposed at a second distance that is larger than the first distance. As a result of disposing the lens members to satisfy such a relationship between positional differences, it is not necessary to provide the first layer with the light-shielding wall 307 for reducing the influence of unnecessary light. Also, the positional difference 309 of the second inner-layer lens 304 may be 0.

Note that, if three or more inner-layer lenses are provided, although the configuration and arrangement of the second inner-layer lens 304 of this embodiment may be applied to an inner-layer lens that is closest (the farthest from the photoelectric conversion unit) to the on-chip microlens, the present invention is not limited thereto.

Note that, in this embodiment, the light-shielding wall 307 is provided to separate adjacent second inner-layer lenses 304 at equal intervals, and thus the center position (the xy-coordinates) of a region formed by the light-shielding wall 307 surrounding a given second inner-layer lens 304 matches the center position of the second inner-layer lens 304. Thus, with regard to a given pixel, a positional difference 311 between the center position of the light-shielding wall 307 and the center position of the photoelectric conversion unit is equal to the positional difference 309 between the center position of the second inner-layer lens 304 and the center position of the photoelectric conversion unit that are provided in the pixel. However, the positional difference 309 of the second inner-layer lens 304 needs not to match the positional difference 311 of the light-shielding wall.

It is presumed that each lens member is produced by reducing (shrinking), in horizontal and vertical directions at fixed ratios, a microlens array in which the center positions of microlenses respectively match the center positions of photoelectric conversion units of pixels, for example. In this case, it is sufficient that the reduction ratio (shrink ratio) is set to satisfy the on-chip microlens 306>the first inner-layer lens 303>the second inner-layer lens (the higher the reduction ratio is, the smaller the lens member is). Also, by arranging the lens members such that the positional difference in the center position is the smallest at the center of the pixel array 102, it is possible to realize the arrangement of the lens members satisfying the above-described relationship between positional differences. In this case, the positional difference in the center position linearly increases following an increase in the image height. In the example shown in FIG. 2, the reduction ratio of the second inner-layer lens is 0.

Figure 3A:
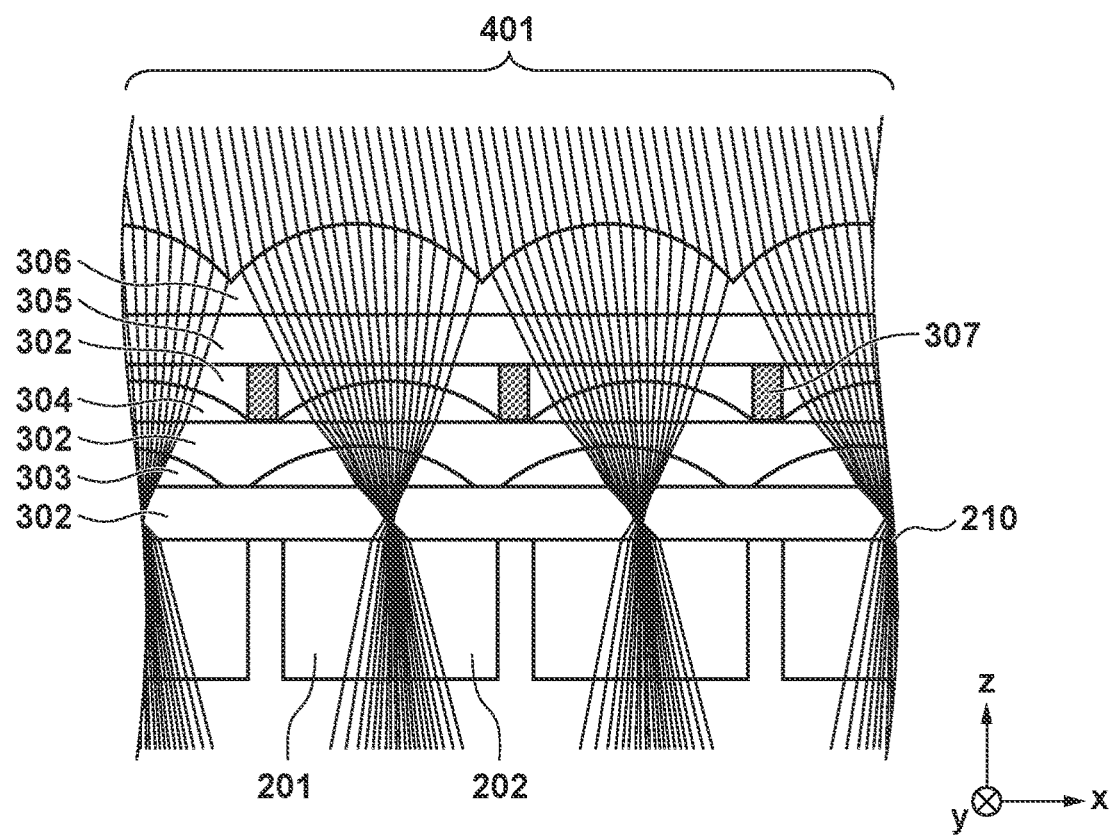
FIGS. 3A and 3B are diagrams schematically showing light paths of light incident on an image sensor according to an embodiment.
Figure 3B:
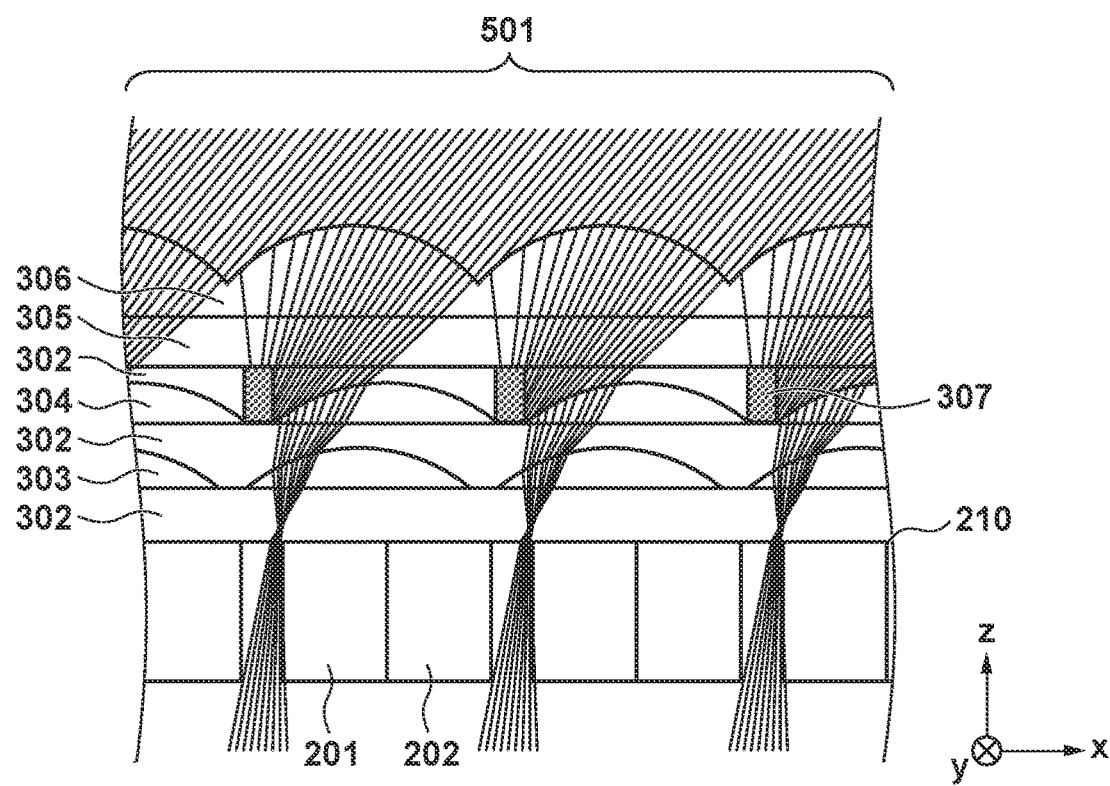

FIGS. 3A and 3B schematically show light paths of incident light in a pixel structure shown in FIG. 2, with regard to luminous fluxes having different angles of incidence. FIG. 3A shows an example of incident light having an angle close to the optical axis, and FIG. 3B shows an example of incident light having a large angle with the optical axis.

Luminous flux 401 is condensed near the center positions (the xy-coordinates) of photoelectric conversion units near surfaces 210 of the photoelectric conversion units. Because the luminous flux 401 has a small angle with the optical axis, the influence of light that is to be incident on and mixed into adjacent pixels need not be basically considered.

On the other hand, with regard to luminous flux 501 having a large angle with the optical axis, mixing of light entering from adjacent pixels need be considered. However, with the configuration of this embodiment, in the luminous flux 501 incident on the on-chip microlens 306 provided in an adjacent pixel, luminous flux traveling in a mixing direction is shielded by the light-shielding wall 307 provided around the second inner-layer lens.

Here, a comparative example in which the lens members are disposed to satisfy the positional difference of the first inner-layer lens 303<the positional difference of the second inner-layer lens 304<the positional difference of the on-chip microlens 306 will be described with reference to FIGS. 6, 7A, and 7B.

Figure 7A:
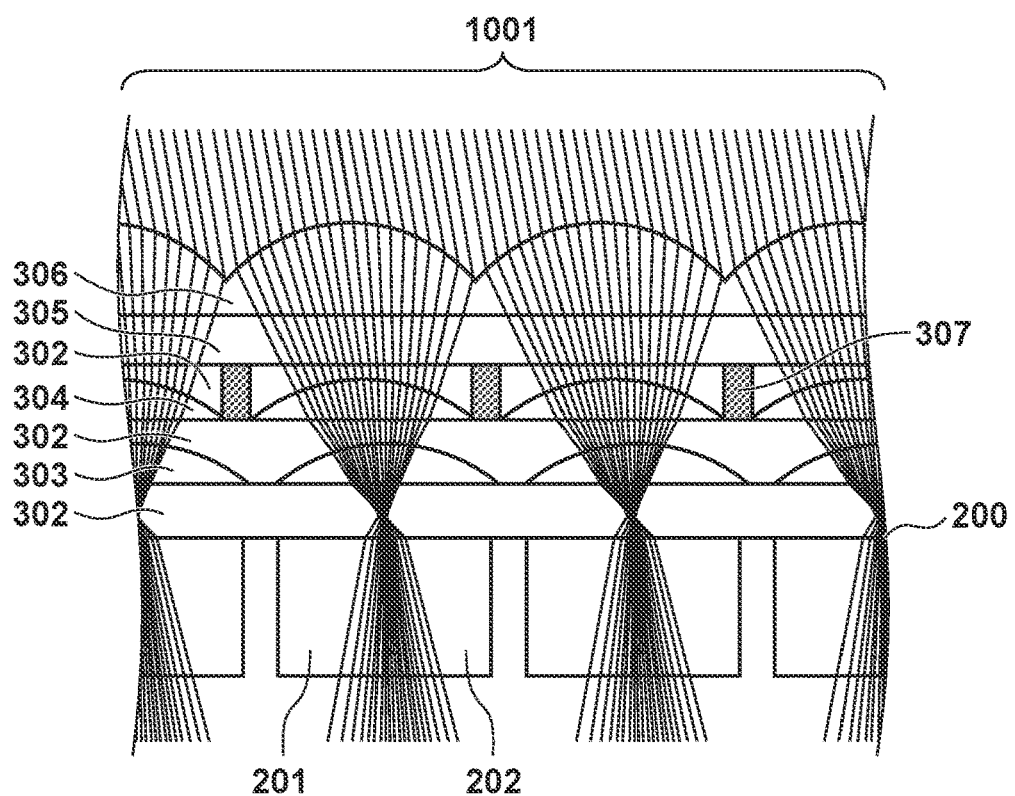
FIGS. 7A and 7B are diagrams schematically showing light paths of light incident on an image sensor according to a comparative example.
Figure 7B:
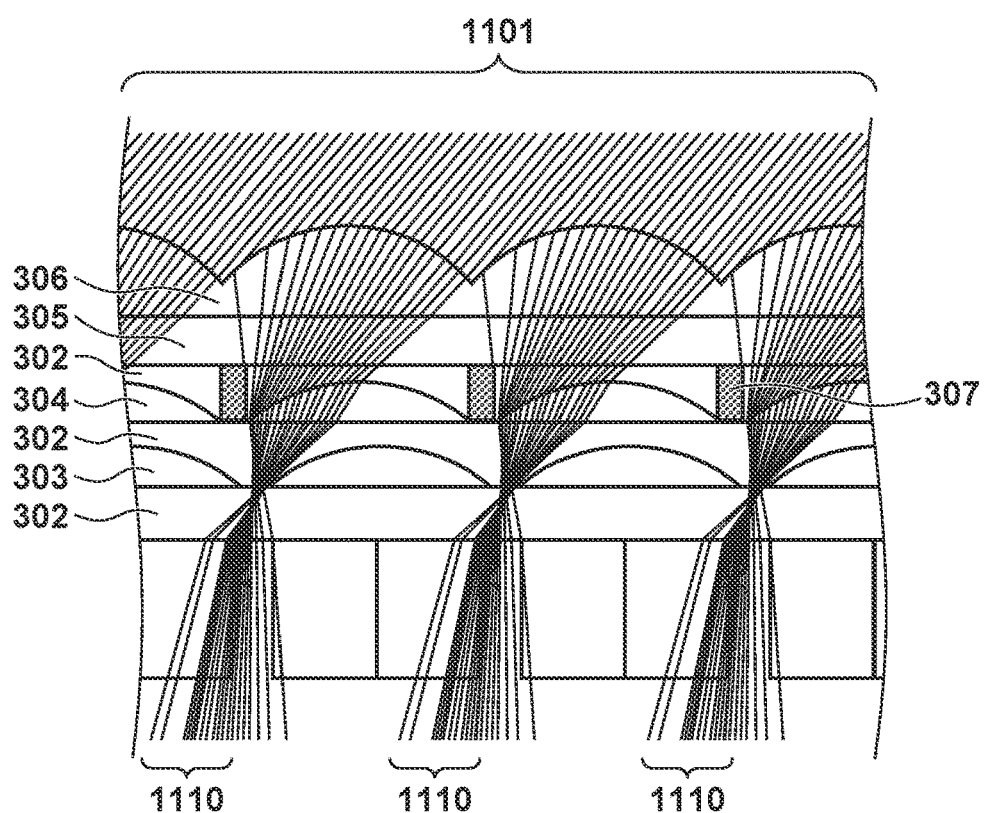

FIG. 6 is a vertical cross-sectional view similar to that of FIG. 2, and FIGS. 7A and 7B are vertical cross-sectional views similar to those of FIGS. 3A and 3B. The configuration thereof is the same, except that the lens members are disposed to satisfy a positional difference 901 of the first inner-layer lens 303<a positional difference 902 of the second inner-layer lens 304<a positional difference 903 of the on-chip microlens 306. Also, the lens members are disposed such that the positional difference 902 of the second inner-layer lens 304 matches the positional difference 904 of the light-shielding wall. In FIGS. 7A and 7B, the angle of incidence of luminous fluxes 1001 and 1101 are respectively equal to the angles of incidence of the luminous fluxes 401 and 501 shown in FIGS. 3A and 3B.

If lens members are disposed such that the larger the distance from a photoelectric conversion unit is, the larger the positional difference in the center position between the photoelectric conversion unit and the lens member is, a difference does not particularly arise in the luminous flux 1001 having a small angle with the optical axis. However, with regard to the luminous flux 1101 having a large angle with the optical axis, luminous flux indicated by reference numeral 1110 is mixed into the photoelectric conversion units of adjacent pixels. In this case, it is necessary to provide light-shielding walls around the first inner-layer lens.

In the example shown in FIGS. 6, 7A, and 7B, the lens members are disposed such that the center position of the second inner-layer lens 304 is located near the midpoint between the center position of the on-chip microlens 306 and the center position of the first inner-layer lens 303. That is, the lens members are disposed such that the center positions of the three lens members are located at equal intervals on a straight line connecting the center position of a photoelectric conversion region of a target pixel and the center of the pixel array 102.

In this embodiment, the center position of the first inner-layer lens 303 is adjusted to be closer to the center of the pixel array than the midpoint between the center position of the on-chip microlens 306 and the center position of the second inner-layer lens 304. Accordingly, luminous flux incident on adjacent pixels can be shielded by the light-shielding walls 307 in FIGS. 6, 7A, and 7B.

As described above, in an image sensor in which an on-chip microlens and a plurality of inner-layer lenses are provided in each pixel, the second inner-layer lens whose distance from the photoelectric conversion unit is larger than that from the photoelectric conversion unit to the first inner-layer lens and in which the positional difference in the center position between the first inner-layer lens and the photoelectric conversion unit is smaller than the positional difference in the center position between the second inner-layer lens and the photoelectric conversion unit is provided. Also, as a result of providing the second inner-layer lens with a light-shielding wall for surrounding the lens for each pixel, it is possible to effectively prevent light from entering from adjacent pixels using a simple configuration.

Second Embodiment

Figure 4:
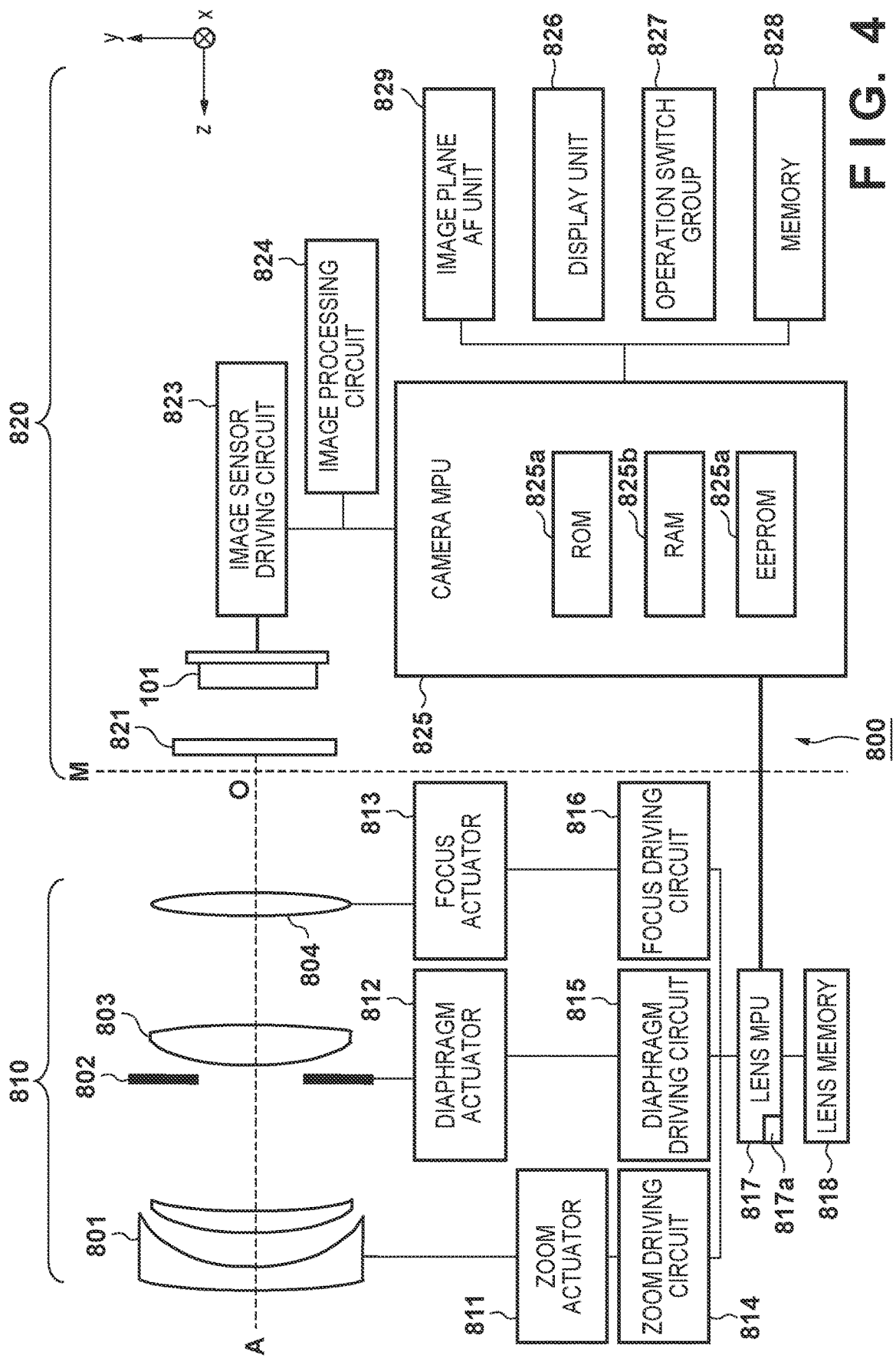
FIG. 4 is a block diagram showing a functional configuration example of an image capture apparatus according to an embodiment.

Next, a second embodiment of the present invention will be described. This embodiment relates to an electronic device in which the image sensor described in the first embodiment is used. FIG. 4 is a block diagram showing a functional configuration example of a digital camera as an example of an electronic device according to this embodiment.

A digital camera 800 of this embodiment uses signals obtained by photoelectric conversion subunits 201 and 201 of an image sensor 101 as imaging signals, simultaneously with use of the signals in phase difference AF. The digital camera 800 of this embodiment is an interchangeable-lens single-lens reflex camera, and includes a lens unit 810 and a camera main body 820. The lens unit 810 is mounted on the camera main body 820 via a mount M indicated by a dotted line.

The lens unit 810 includes an optical system (a first lens group 801, a diaphragm 802, a second lens group 803, a focus lens group (simply referred to as a "focus lens" hereinafter) 804), and a driving/control system. The lens unit 810 includes a focus lens 804, and is an imaging lens that forms an optical image of a subject.

The first lens group 801 is disposed at a leading end of the lens unit 810, and is held movably along an optical axis OA. The diaphragm 802 functions to adjust the amount of light at the time of imaging, and also functions as a mechanical shutter for controlling the exposure time when capturing a still image. However, if the image sensor 101 has a global shutter mechanism, the diaphragm need not be used as a mechanical shutter.

The diaphragm 802 and the second lens group 803 are movable as a single member along the optical axis OA, and realizes a zoom function through movement together with the first lens group 801. The focus lens 804 is also movable along the optical axis OA, and the subject distance (the in-focus distance) at which the lens unit 810 is focused on changes according to the position of the focus lens 804. Focus adjustment for adjusting the in-focus distance of the lens unit 810 is an operation for controlling the position of the focus lens 804.

The driving/control system includes a zoom actuator 811, a diaphragm actuator 812, a focus actuator 813, a zoom driving circuit 814, a diaphragm driving circuit 815, a focus driving circuit 816, a lens MPU 817, and a lens memory 818.

The zoom driving circuit 814 drives the first lens group 801 and the third lens group 803 using the zoom actuator 811 to change the angle of view of the optical system of the lens unit 810. The diaphragm driving circuit 815 drives the diaphragm 802 using the diaphragm actuator 812 to change the aperture diameter of the diaphragm 802 and execute open and close operation. The focus driving circuit 816 drives the focus lens 804 using the focus actuator 813 to change the in-focus distance of the optical system of the lens unit 810. Also, the focus driving circuit 816 detects the current position of the focus lens 804 using the focus actuator 813.

The lens MPU (processor) 817 performs overall calculation and control relating to the lens unit 810 to control the zoom driving circuit 814, the diaphragm driving circuit 815, and the focus driving circuit 816. Also, the lens MPU 817 is electrically connected to a camera MPU 825 via the mount M, and communicates commands and data with the camera MPU 825.

The lens MPU 817 detects the position of the focus lens 804 through the focus driving circuit 816, and notifies the camera MPU 825 of lens position information in response to a request transmitted from the camera MPU 825, for example. Lens position information includes information regarding the position of the focus lens 804 on the optical axis OA, the position and the diameter of an exit pupil on the optical axis OA when the optical system is not moving, the position and the diameter, on the optical axis OA, of a lens frame for limiting luminous flux of an exit pupil, for example. Also, the lens MPU 817 controls the zoom driving circuit 814, the diaphragm driving circuit 815, and the focus driving circuit 816 in response to a request transmitted from the camera MPU 825. The request transmitted from the camera MPU 825 is given as a command.

The lens memory 818 is a non-volatile memory, and optical information required for autofocus detection (AF) of the lens unit 810, programs executed by the lens MPU 817, and the like are prestored therein. The lens MPU 817 controls operations of the lens unit 810 by loading a program stored in the lens memory 818 into a built-in RAM 817a, and executing the program.

The camera main body 820 includes an optical system (an optical lowpass filter 821 and an image sensor 101) and a driving/control system. The first lens group 801, the diaphragm 802, the second lens group 803, and the focus lens 804 of the lens unit 810, and the optical lowpass filter 821 of the camera main body 820 constitute the optical system.

The optical lowpass filter 821 reduces false color and moire of a captured image. The image sensor 101 is the image sensor described in the first embodiment, and, here, it is presumed that 6000 pixels (12000 photoelectric conversion subunits) are disposed in the horizontal direction of a pixel array 102 and 4000 pixels are disposed in the vertical direction thereof.

The driving/control system includes an image sensor driving circuit 823, an image processing circuit 824, a camera MPU 825, a display unit 826, an operation switch group 827, a memory 828, and an image plane phase-difference focus detection unit (simply referred to as an image plane AF unit) 829.

The image sensor driving circuit 823 controls the operations of the image sensor 101 and supplies signals that are read out from the image sensor 101 to the image processing circuit 824 and the camera MPU 825. The image sensor driving circuit 823 also controls types of signals (signals of the photoelectric conversion subunit 201 or 202, or signals obtained through addition of the signals of the photoelectric conversion subunit 201 or 201) that are read out from the pixels of the image sensor 101.

The image processing circuit 824 applies predetermined image processing to image signals obtained from the photoelectric conversion subunits of the image sensor 101, generates signals and image data, acquires and/or generates various types of information. The image processing circuit 824 may be a dedicated hardware circuit such as an ASIC designed to realize a specific function, or may be configured to realize a specific function as a result of a programmable processor such as a DSP executing software, for example.

Here, image processing applied by the image processing circuit 824 includes preprocessing, color interpolation processing, correction processing, detection processing, data processing, evaluation value calculation processing, and the like. Preprocessing includes signal amplification, reference level adjustment, defective pixel correction, and the like. Color interpolation processing is processing for interpolating values of color components that are not included in image data that is read out from pixels, and is also called demosaic processing. Correction processing includes white balance adjustment, processing for correcting luminance of an image, processing for correcting aberration of the optical system of the lens unit 810, processing for correcting a color, and the like. Detection processing includes processing for detecting and tracking a feature region (e.g., a face region and a human body region), processing for recognizing a person, and the like. Data processing includes scaling processing, encoding and decoding processing, header information generation processing, and the like. Evaluation value calculation processing is processing for generating a pair of image signals for phase difference AF and evaluation values for contrast AF, and calculating evaluation values used in automatic exposure control, for example. Note that these processes are examples of image processing that can be implemented by the image processing circuit 824, and do not limit image processing implemented by the image processing circuit 824.

The camera MPU 825 includes a ROM 825a, a RAM 825b, and an EEPROM 825c. Programs executed by the camera MPU 825 are stored in the ROM 825a. Also, various setting values, GUI data, and the like are stored in the EEPROM 825c. The camera MPU 825 controls operations of the camera main body 820 and the lens unit 810 by loading a program from the ROM 825a into the RAM 825b and executing the program. Note that the programs may also be stored in the EEPROM 825c.

The camera MPU (microprocessor) 825 performs overall calculation and control relating to the camera main body 820, and controls the image sensor driving circuit 823, the image processing circuit 824, the display unit 826, the operation switch group 827, the memory 828, and the image plane AF unit 829. The camera MPU 825 is connected to the lens MPU 817 via a signal line of the mount M, and communicates commands and data with the lens MPU 817. The camera MPU 825 transmits, to the lens MPU 817, commands indicating a lens position acquisition request, and requests for driving a diaphragm, a focus lens, and zooming, a request to acquire optical information specific to the lens unit 810, and the like. The lens MPU 817 transmits required information to the camera MPU 825, or executes a required driving operation, in response to these commands.

The display unit 826 is a liquid crystal display, for example, and displays information regarding the digital camera 800, an image obtained by the image sensor 101, an image indicating a focus position, a menu screen, and the like. The operation switch group 827 is constituted by a power source switch, a release (imaging trigger) switch, a zoom operation switch, an imaging mode selection switch, and the like.

The memory 828 is a detachable memory card, for example, and data files of captured moving images and still images are recorded therein. If a moving image and a still image can be captured in parallel, for example, the memory 828 may be prepared separately for a moving image and a still image.

The image plane AF unit 829 detects a phase difference between a pair of image signals for phase difference AF generated by the image processing circuit 824, and obtains a defocus amount and a defocus direction of the optical system of the lens unit 810 from the detected phase difference. The image plane AF unit 829 outputs, to the camera MPU 825, the obtained defocus amount and defocus direction.

The camera MPU 825 determines the driving amount and the driving direction of the focus lens 804 based on the defocus amount and the defocus direction. Also, the camera MPU 825 requires the lens MPU 817 to drive the focus lens 804, with the determined driving direction and the determined driving amount.

Here, phase difference AF will be described.

Figure 5A:
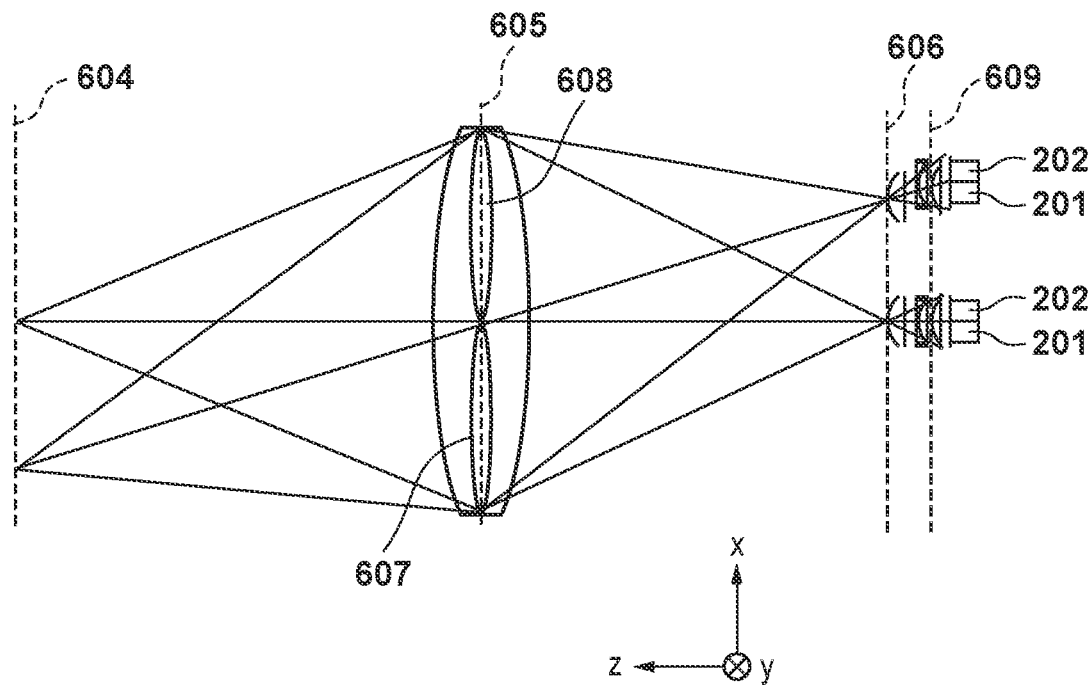
FIGS. 5A and 5B are schematic diagrams regarding pupil division using a photoelectric conversion subunit, and the relationship between image shift amounts and defocus amounts.

FIG. 5A schematically shows pupil division performed by the photoelectric conversion subunits 201 and 202. A line 604 indicates the position of a subject, and a subject image is formed on an imaging plane 606 of the image sensor 101 using the optical system located at a position 605. Also, reference numeral 609 indicates the position located near the surfaces of the photoelectric conversion subunits 201 and 202. The photoelectric conversion subunits 201 and 202 that are divided into two in the x-direction respectively receive luminous flux that has passed through a pupil partial region 607 and a pupil partial region 608, out of an exit pupil of the optical system.

Thus, with regard to a plurality of pixels included in a focus detection region, an image signal obtained by connecting signals obtained by the photoelectric conversion subunits 201 and an image signal obtained by connecting signals obtained by the photoelectric conversion subunits 202 form a pair of image signals having disparity. The image processing circuit 824 generates, as image signals for phase difference AF, such a pair of image signals. Also, the image processing circuit 824 can obtain image signals for generating image signals for displaying and recording by adding signals obtained by the photoelectric conversion subunits 201 and 202 for each pixel.

Note that, for each pixel, a signal obtained from the photoelectric conversion subunit 202 may be generated by reading out a signal obtained from the photoelectric conversion subunit 201 and a signal obtained through addition of signals obtained by the photoelectric conversion subunits 201 and 202, and reducing, from the added signal, the signal obtained from the photoelectric conversion subunit 201.

Figure 5B:
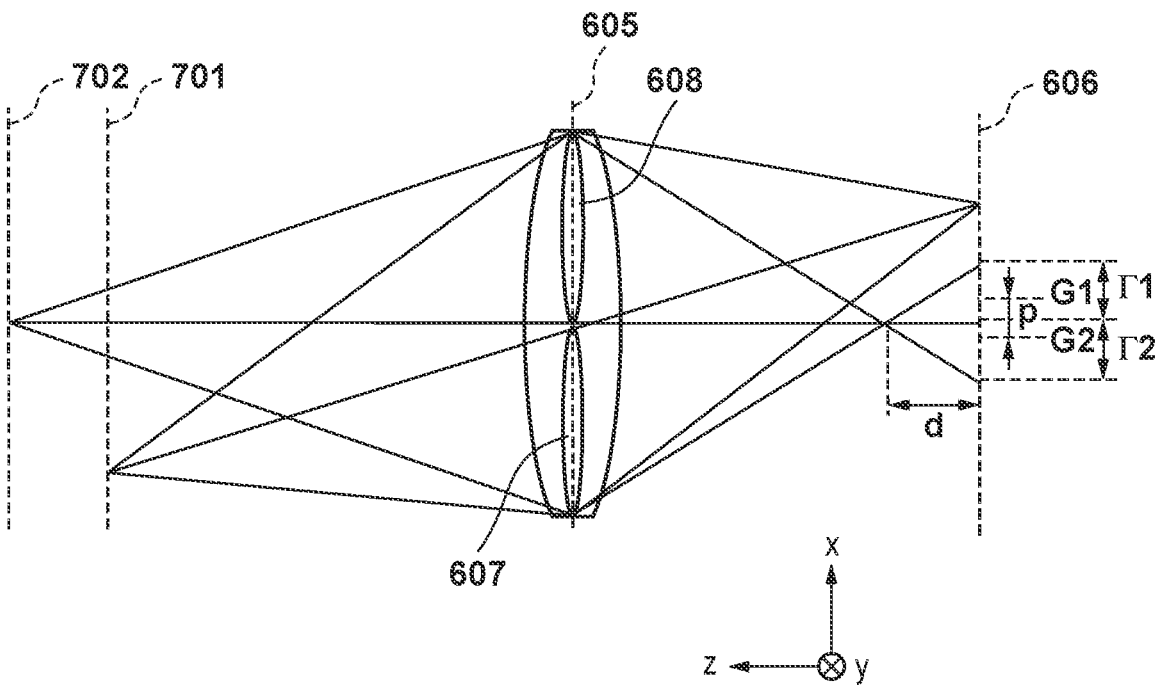

FIG. 5B shows a schematic relationship between a phase difference (an image shift amount) between a pair of image signals for phase difference AF and the defocus amount of the optical system of the lens unit 810. The magnitude of a distance |d| between the position at which a subject image is formed and the imaging plane indicates the defocus amount. Also, the defocus direction is indicated by a sign of the defocus amount. Specifically, a negative sign (d<0) indicates a front-focused state in which the subject image formation position is closer to the subject side than the imaging plane 606, and a positive sign (d>0) indicates a rear-focused state in which the subject image formation position is located on the opposite side of the subject with respect to the imaging plane 606.

In a focused state, the subject image formation position is equal to the position of the imaging plane 606, and thus the defocus amount d is 0. In FIG. 5B, reference numeral 701 indicates the position of a subject entering the focused state (d=0), and reference numeral 702 indicates an example of a subject entering the front-focused state (d<0). The front-focused state (d<0) and the rear-focused state (d>0) are both the defocus state (|d|>0).

In the front-focused state (d<0), in luminous flux from a subject located at a position 702, luminous flux that has passed through the pupil partial region 607 (608) is condensed once, and spreads around a position of the center of gravity G1 (G2) of the luminous flux to a width Γ1 (Γ2), and forms a blurred image on the imaging plane 606. The blurred image is received by the photoelectric conversion subunits 201 and 202. Thus, an image signal obtained based on the photoelectric conversion subunits 201 and an image signal obtained based on the photoelectric conversion subunits 202 are recorded as a subject image in which the subject 702 is blurred to have a width Γ1 (Γ2) at the position of the center of gravity G1 (G2). The blur width Γ1 (Γ2) of the subject image roughly proportionally increases following an increase in the magnitude of the defocus amount d. Similarly, the magnitude of an image shift amount p (=G1−G2) of a subject image between disparity images also roughly proportionally increases following an increase in the magnitude of the defocus amount d. The same applies to the rear-focused state (d>0), although an image shift direction of a subject image between disparity images is opposite to that of the front-focused state. In the focused state (d=0), the positions of the centers of gravity of subject images between disparity images match each other (p=0), and image shift does not occur.

An image shift amount (a phase difference) between the image signal that is based on the photoelectric conversion subunits 201 and the image signal that is based on the photoelectric conversion subunits 202 increases following an increase in the magnitude |d| of the defocus amount. Thus, the image processing circuit 824 can obtain the defocus amount and the defocus direction by detecting the image shift amount (the phase difference) between a pair of image signals for phase difference AF.

Other Embodiments

In the above-described embodiments, examples were described in which the present invention is applied to an image sensor in which photoelectric conversion units of pixels are divided into a plurality of units. However, the present invention can also be applied in a similar manner to an image sensor in which photoelectric conversion units of pixels are not divided.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-019959, filed on Feb. 6, 2019, which is hereby incorporated by reference herein in its entirety.

What is claimed is:

1. An image sensor comprising a pixel array in which pixels each including a photoelectric conversion unit are two-dimensionally arranged, wherein:
   the pixels each include, in addition to the photoelectric conversion unit, a first inner-layer lens, a second inner-layer lens whose distance from the photoelectric conversion unit is larger than a distance from the photoelectric conversion unit to the first inner-layer lens, and an on-chip microlens whose distance from the photoelectric conversion unit is larger than the distance from the photoelectric conversion unit to the second inner-layer lens;
   a light-shielding wall around the second inner-layer lens is provided between adjacent pixels; and
   a first positional difference between a center position of the first inner-layer lens and a center position of the photoelectric conversion unit, a second positional difference between a center position of the second inner-layer lens and the center position of the photoelectric conversion unit, and a third positional difference between a center position of the on-chip microlens and the center position of the photoelectric conversion unit satisfy the following relationship:
   the second positional difference<the first positional difference<the third positional difference.

2. The image sensor according to claim 1,
   wherein the first positional difference, the second positional difference, and the third positional difference each indicates a positional difference in a direction toward a center of the pixel array.

3. The image sensor according to claim 1,
   wherein the first positional difference, the second positional difference, and the third positional difference of a pixel having a second image height that is larger than a first image height are larger than the first positional difference, the second positional difference, and the third positional difference of a pixel having the first image height.

4. The image sensor according to claim 1, wherein the second positional difference is 0.

5. The image sensor according to claim 1, wherein no light-shielding wall is provided around the first inner-layer lens.

6. The image sensor according to claim 1, wherein the second inner-layer lens is an inner-layer lens that is closest to the on-chip microlens.

7. The image sensor according to claim 1, wherein the center position of the first inner-layer lens is closer to a center of the pixel array than a midpoint between the center position of the second inner-layer lens and the center position of the on-chip microlens.

8. The image sensor according to claim 1, wherein the photoelectric conversion unit is divided into a plurality of photoelectric conversion subunits.

9. An image capture apparatus that comprises and uses an image sensor, wherein the image sensor comprises a pixel array in which pixels each including a photoelectric conversion unit are two-dimensionally arranged, wherein:
the pixels each include, in addition to the photoelectric conversion unit, a first inner-layer lens, a second inner-layer lens whose distance from the photoelectric conversion unit is larger than a distance from the photoelectric conversion unit to the first inner-layer lens, and an on-chip microlens whose distance from the photoelectric conversion unit is larger than the distance from the photoelectric conversion unit to the second inner-layer lens;
a light-shielding wall around the second inner-layer lens is provided between adjacent pixels; and
a first positional difference between a center position of the first inner-layer lens and a center position of the photoelectric conversion unit, a second positional difference between a center position of the second inner-layer lens and the center position of the photoelectric conversion unit, and a third positional difference between a center position of the on-chip microlens and the center position of the photoelectric conversion unit satisfy the following relationship:
the second positional difference<the first positional difference<the third positional difference.

10. An image capture apparatus comprising:
an image sensor that comprises a pixel array in which pixels each including a photoelectric conversion unit being divided into a plurality of photoelectric conversion subunits are two-dimensionally arranged, wherein:
the pixels each include, in addition to the photoelectric conversion unit, a first inner-layer lens, a second inner-layer lens whose distance from the photoelectric conversion unit is larger than a distance from the photoelectric conversion unit to the first inner-layer lens, and an on-chip microlens whose distance from the photoelectric conversion unit is larger than the distance from the photoelectric conversion unit to the second inner-layer lens;
a light-shielding wall around the second inner-layer lens is provided between adjacent pixels; and
a first positional difference between a center position of the first inner-layer lens and a center position of the photoelectric conversion unit, a second positional difference between a center position of the second inner-layer lens and the center position of the photoelectric conversion unit, and a third positional difference between a center position of the on-chip microlens and the center position of the photoelectric conversion unit satisfy the following relationship;
the second positional difference<the first positional difference<the third positional difference;
an image processing circuit configured to generate a pair of image signals for phase difference AF based on signals obtained by the plurality of photoelectric conversion subunits of the image sensor; and
one or more processors that execute a program stored in a memory and thereby function as:
a focus detection unit configured to perform focus detection of an optical system of a lens unit based on a phase difference between the pair of image signals.

* * * * *